(12) United States Patent
Miwa et al.

(10) Patent No.: US 6,653,032 B2
(45) Date of Patent: Nov. 25, 2003

(54) EXPOSURE METHOD

(75) Inventors: Toshiharu Miwa, Tokyo (JP); Yasuhiro Yoshitake, Tokyo (JP); Tetsuya Yamazaki, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/026,991

(22) Filed: Dec. 18, 2001

(65) Prior Publication Data

US 2002/0076629 A1 Jun. 20, 2002

(30) Foreign Application Priority Data

Dec. 20, 2000 (JP) ........................................ 2000-391824

(51) Int. Cl.$^7$ .............................. G03F 9/00; G03C 5/00
(52) U.S. Cl. ........................................................ 430/30
(58) Field of Search ............................................. 430/30

(56) References Cited

FOREIGN PATENT DOCUMENTS

JP          11-267952          10/1999

*Primary Examiner*—Christopher G. Young
(74) *Attorney, Agent, or Firm*—Townsend and Townsend and Crew LLP

(57) ABSTRACT

In lithographic (exposure) processing for semiconductor device fabrication, the task of extracting exposure parameters is performed by calculating exposure energy and focus offset using a test wafer for each exposure device, because fluctuations due to differences between exposure devices are large. For the fabrication of semiconductor devices in multiple-product small-lot production, the number of times the task of extracting exposure parameters has to be performed increases, so that the operation ratio of the exposure devices decreases, and the TAT of the semiconductor device fabrication increases. Moreover, as the miniaturization of semiconductor devices advances, differences between the exposure devices cause defects due to the exposure processing, and the yield of the semiconductor device fabrication decreases. In an improved method of exposure processing for semiconductor devices, the exposure energy and focus offset according to the illumination parameters for an exposure device and optical projection system, using information regarding the projection lens aberrations of a plurality of exposure devices, the photoresist parameters, and the circuit pattern information, as determined beforehand, are calculated using an optical development simulator, and the exposure processing is carried out using an exposure device, selected from a plurality of exposure devices, in which the process window is within a certain tolerance value.

4 Claims, 8 Drawing Sheets

FIG.5
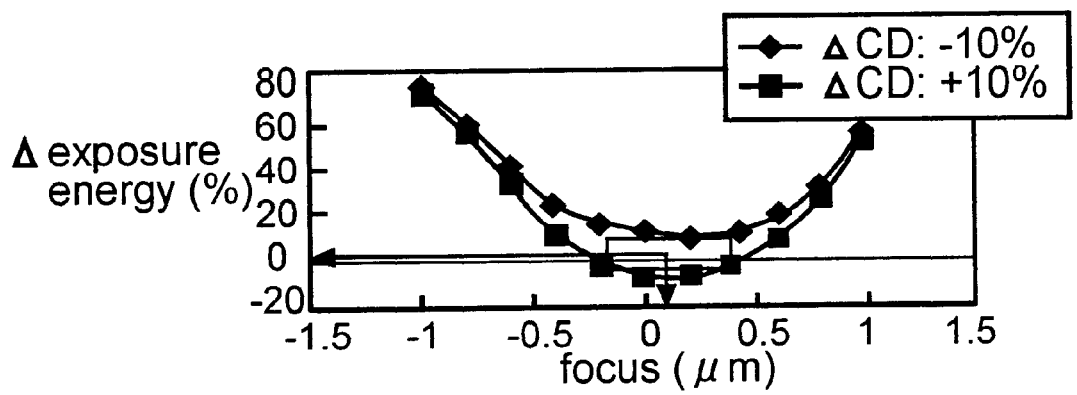
(1) without aberration
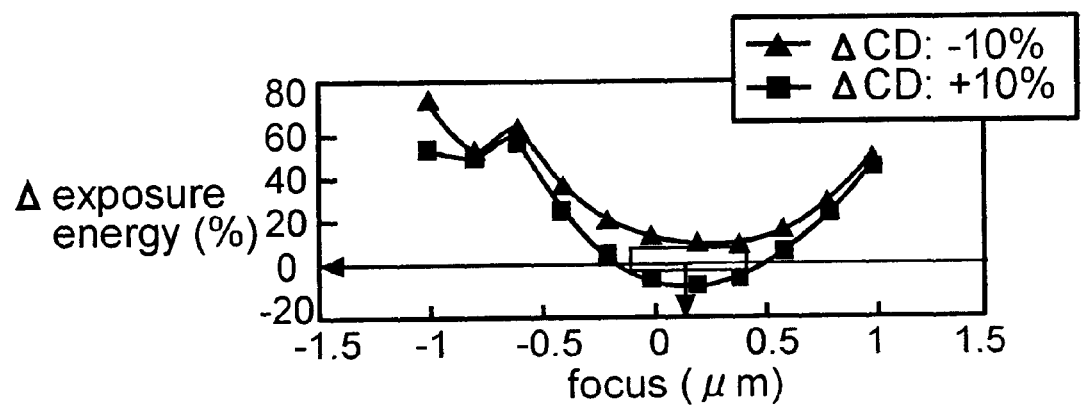
(2) with third-order spherical aberration; for 0.05 λ

FIG.8

```
                    start
                      │
201  ─── obtain device type and
         exposure step
                      │
202  ─── obtain operation information
         of exposure device
                      │
203  ─── look up reticle
         usage information
                      │
204  ─── look up dispatch rules
                      │
205  ─── look up process window
         information of exposure device
                      │
206  ─── calculate optimum exposure
         device and reticle
                      │
207  ─── look up optimum exposure
         energy and focus offset
                      │
208  ─── start exposure processing
                      │
                     end
```

FIG.9

| semiconductor device | |
|---|---|
| exposure step | |
| exposure device | |
| reticle | |
| exposure energy | |
| focus offset | |

FIG.12

| device | assessment index P1 (production progress) | assessment index P2 (yield) |
|---|---|---|
| #1 | 1 | 5 |
| #2 | 3 | 3 |
| #3 | 5 | 2 |
| #4 | 4 | 2 |
| #5 | 5 | 1 |

$P = k1 \times P1 + k2 \times P2$

| assessment index P (total) |
|---|
| 8.5 |
| 7.5 |
| 8 |
| 7 |
| 6.5 |

K1=1, k2=1.5

EXPOSURE METHOD

CROSS-REFERENCES TO RELATED APPLICATIONS

This application claims priority from Japanese Patent Application No. 2000-391824, filed Dec. 20, 2000.

STATEMENT AS TO RIGHTS TO INVENTIONS MADE UNDER FEDERALLY SPONSORED RESEARCH OR DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK.

NOT APPLICABLE

BACKGROUND OF THE INVENTION

1. Field of the Invention

The present invention relates to a method for fabricating semiconductor devices, and more particularly to a method for lithographic processing, in which a circuit pattern is transferred onto a semiconductor device.

2. Description of the Related Art

When, in the fabrication of semiconductor devices, a circuit pattern is lithographically transferred to a substrate wafer of a semiconductor device (hereinafter referred to as "wafer"), numerous exposure steps and etching steps are necessary. FIG. 2 illustrates a method for transferring a circuit pattern onto an insulating film formed on the wafer. First, in an exposure step, a circuit pattern is transferred onto a photoresist film on the wafer. Then, in an etching step, using the photoresist pattern formed in the exposure step as a mask, a circuit pattern is formed in the insulating film on the wafer. More specifically, in a first exposure process a photoresist film is formed on the wafer by an application process. In a second exposure process, the circuit pattern is transferred to the photoresist using an exposure device. After that, the exposed photoresist is put through a developing process to form a photoresist pattern.

FIG. 3 shows the configuration of a reduction projection exposure device used mainly for the lithographic (hereinafter "exposure") step. With this exposure device, a circuit pattern formed by etching metal on a glass "reticle" (a mask usually made of quartz glass) is exposed through a reduction lens, to pattern one or more chips on a wafer at a time. By changing the reticles in subsequent exposure steps, the circuit patterns necessary for fabricating a semiconductor device can be formed on the wafer. With the resolution of the circuit pattern and the pattern arrangement that takes place in the exposure steps, it is possible to optimize the illumination conditions of the optical projection system of the exposure device, such as the numerical aperture NA and the illumination coherency σ, as well as the photoresist parameters (type, thickness, etc.).

In order to satisfy the electrical properties of a semiconductor device, not only the resolution, but also the variations in the dimensions of the transfer pattern have to be within tolerance ranges. For example, variations in the gate dimension of a transistor may cause variations in the threshold voltage of a transistor, so that variations in the photoresist pattern dimensions have to be set within a certain tolerance range. There are many causes of dimensional fluctuations in the photoresist pattern, such as focus shifts, discrepancies when producing the circuit pattern on the reticles, aberrations in the reduction lens of the exposure device, or variations caused by the application or developing processes. In actuality, the fluctuations in the exposure device are the most important, so that the exposure energy and the offset of the focus when transferring a circuit pattern are set for each reticle, exposure step, and exposure device, and the dimension of the photoresist pattern portion with the smallest margin in the exposure steps (critical dimension, hereinafter referred to as "CD") is adjusted to be within a certain tolerance value. At present, the optimum values for the exposure energy and the focus offset are calculated for each reticle, exposure step and exposure device by measuring the CD of a test wafer that is exposed with different exposure energies and focuses (also called "extracting the exposure conditions"). At this time, a process window of exposure energy and focus, in which the CD values are within a certain tolerance value, is produced, and the central value of that window is taken as the optimum value of exposure energy and focus offset. Moreover, the larger the window, the higher is the margin with respect to CD fluctuations in the exposure step, so that the process window can be used as an assessment index of the exposure step. FIG. 4 illustrates a method for calculating the optimum values of exposure energy and focus offset using the process window for the exposure step. The process window of the exposure energy and focus is calculated using the CD values of a test wafer that is exposure processed while changing the exposure energy and the focus offset within a certain tolerance. Here, an example is shown in which, for the same reticle, the process windows as well as the final optimum exposure energy and focus offset differ depending on whether device A or device B is used for the exposure step.

On the other hand, fabrication for multiple-product small-lot production of semiconductor devices increases the number of times the exposure parameters must be extracted, a task which is performed for each reticle, exposure step and exposure device, so that the TAT (turn-around time) for newly ordered/in-process semiconductor devices in increases as well. It is possible to limit the number of times the task of extracting the exposure parameters is performed by fixing the exposure parameters of the exposure devices used for each type of semiconductor device, but variations in the operation ratio of exposure devices occur, which lead to a lower throughput of all exposure steps.

As a way to solve this problem, Aida et al. (Electronic Information Society, Introduction into Response Surface Functions For Statistical Design of Optical Lithography Processes, 1996), for example, have proposed a method for producing response surface functions of CD values, using exposure energy, focus offset and the illumination parameters of the optical projection system (numerical aperture NA and illumination coherency σ) as variables, and calculating exposure energy and focus offset from these response surface functions.

To increase the operation ratio of the fabrication equipment, a system for automatically selecting and assigning equipment in accordance with the operation ratio of the fabrication equipment, also referred to as "dispatching", which depends on certain rules such as "FIFO" or "priority on delivery time", has been implemented (for example, "Siview", IBM Japan), and is currently used for the assignment of exposure devices.

Furthermore, JP H11-267952A proposes a production control system, in which the fabrication variations in each step are reduced and the quality and yield are improved.

In the fabrication of multiple-product small-lot production of semiconductor devices such as system LSIs, the number of times the task of extracting the exposure parameters is performed for each reticle, exposure step and exposure device for the fabrication of new products, and the TAT of the products are higher than for mass-produced products such as memory devices. By fixing the exposure parameters of the exposure devices used for each type of semiconductor device, the number of times the task of extracting the exposure parameters has to be performed can be reduced, but this causes irregularities in the operation ratio, and leads to a decrease in the throughput of all exposure steps.

In the approach for calculating the exposure energy and focus offset proposed by Aida et al., as mentioned above, it is possible to calculate the optimum values of exposure energy and focus offset due to differences in the illumination parameters of the optical projection system. However, to calculate the exposure energy and focus offset for a plurality of exposure devices is problematic: there are differences between the exposure devices, such as differences in the aberrations of the projection lenses, so that the response surface functions have to be produced and corrected for each exposure device. Furthermore, information regarding the circuit pattern is not taken into account, so that it is not possible to correct fluctuations of the exposure energy and the focus offset that depend on the circuit pattern.

In dispatch systems that have been put into practice, the devices that are used can be assigned based on the operation conditions and in-process information of the current fabrication equipment, but the number of times that the task of extracting the exposure conditions has to be performed cannot be reduced. Accordingly, it is not possible to assign exposure devices for which the setting of the exposure parameters has not been carried out, and such devices cannot be used to diminish the increase in the TAT of semiconductor devices caused by the increase in the number of times that the task of extracting the exposure conditions has to be performed for multiple-product small-lot production.

In JP H11-267952A, a combination of fabrication devices is selected using workmanship data when machining is performed. Because there is no workmanship data in the case of newly ordered/in-process semiconductor devices, this approach cannot be used in such cases.

Moreover, if the miniaturization of the device pattern progresses, even with the same illumination conditions, the process windows will fluctuate depending on differences among the exposure devices due to the aberrations of their projection lenses, so that the production yields for the semiconductor devices will also vary due to the differences among the exposure devices. When forming very detailed circuit patterns, it is necessary to perform exposure processing after comparing the process windows of a plurality of exposure devices, and selecting an exposure device with a large process window, to improve the yield.

SUMMARY OF THE INVENTION

It is thus an object of the present invention to present a method for lithographic processing of semiconductor devices and an exposure system for use in that process that has a means for calculating the margins of exposure energy and focus, as well as for calculating the optimum values of exposure energy and focus offset, which change depending on the aberration of the projection lenses of the exposure devices; and a means for assigning an exposure device used for such processing, based on the calculated margins of exposure energy and focus.

The present invention includes, in one embodiment, a first database storing aberration information (for example, Zernike coefficients) of projection lenses of a plurality of exposure devices; a second database storing process specification information such as illumination parameters (e.g., exposure wavelength, numerical aperture NA of lenses, illumination coherency σ); photoresist parameters (e.g., type, thickness and development time) and tolerance CD values for the exposure steps of the semiconductor device fabrication; a third database storing circuit pattern information used for the exposure steps of the semiconductor device fabrication; a fourth database storing dispatch rules of the exposure devices; a fifth database in which the margins of exposure energy and focus as well as the optimum values of exposure energy and focus offset for the steps on the plurality of exposure devices are registered; an exposure parameter calculation processing portion for calculating the margins of exposure energy and focus as well as the optimum values of exposure energy and focus offset; and an exposure device assignment processing portion for selecting an exposure device to be used for the exposure step based on the margins of exposure energy and focus of the plurality of exposure devices and the dispatch rules of the exposure device, and executing the exposure processing.

The exposure parameter calculation processing portion performs:

(1) a step of looking up illumination parameters of the optical projection system used for the exposure processing and photoresist parameters;

(2) a step of looking up circuit pattern information used for the exposure processing;

(3) a step of looking up aberration information of the projection lens of the exposure device; and (4) a step of calculating margins of exposure energy and focus as well as optimum values of exposure energy and focus offset for exposure processing with an optical development simulator, based on the information looked up in steps (1) to (3).

By executing steps (1) to (4) in order, it becomes possible to calculate exposure energy and focus offset in consideration of the fluctuations of the process windows due to aberrations of the projection lenses of the exposure devices without performing the task of extracting the exposure parameters.

The exposure device assignment processing portion performs:

(5) a step of looking up the margins of exposure energy and focus for a plurality of exposure devices calculated by the exposure parameter calculation processing portion;

(6) a step of looking up the dispatch rules of the exposure devices; and (7) a step of selecting an exposure device based on the margins of exposure energy and focus as well as the dispatch rules.

By executing the steps (5) to (7) in order, it becomes possible to carry out exposure processes with exposure devices having taken into consideration the fluctuations of the process windows and the device operation state.

Thus, the exposure energy and focus offset, which fluctuate depending on the aberration of the projection lens of the exposure device, can be determined without performing the task of extracting the exposure parameters. Furthermore, it becomes possible to improve the production yield of the semiconductor devices by selecting, from a plurality of exposure devices, an exposure device with a large process window.

BRIEF DESCRIPTION OF THE DRAWINGS

FIG. 5 is a diagram illustrating the variations of the process windows due to different aberrations of the projection lenses;

FIG. 8 is a flowchart illustrating a method in accordance with the present invention for performing exposure processing by selecting an exposure device in which the margins for exposure energy and focus are large;

FIG. 9 is a diagram showing an example of an output screen of the calculation results for the exposure device, reticle, exposure energy and focus offset in accordance with the present invention;

FIG. 12 is a diagram illustrating a method for selecting an exposure device in accordance with the present invention.

DETAILED DESCRIPTION OF THE INVENTION

The following is a description of the preferred embodiments of the present invention, with reference to the accompanying drawings.

Figure 1:
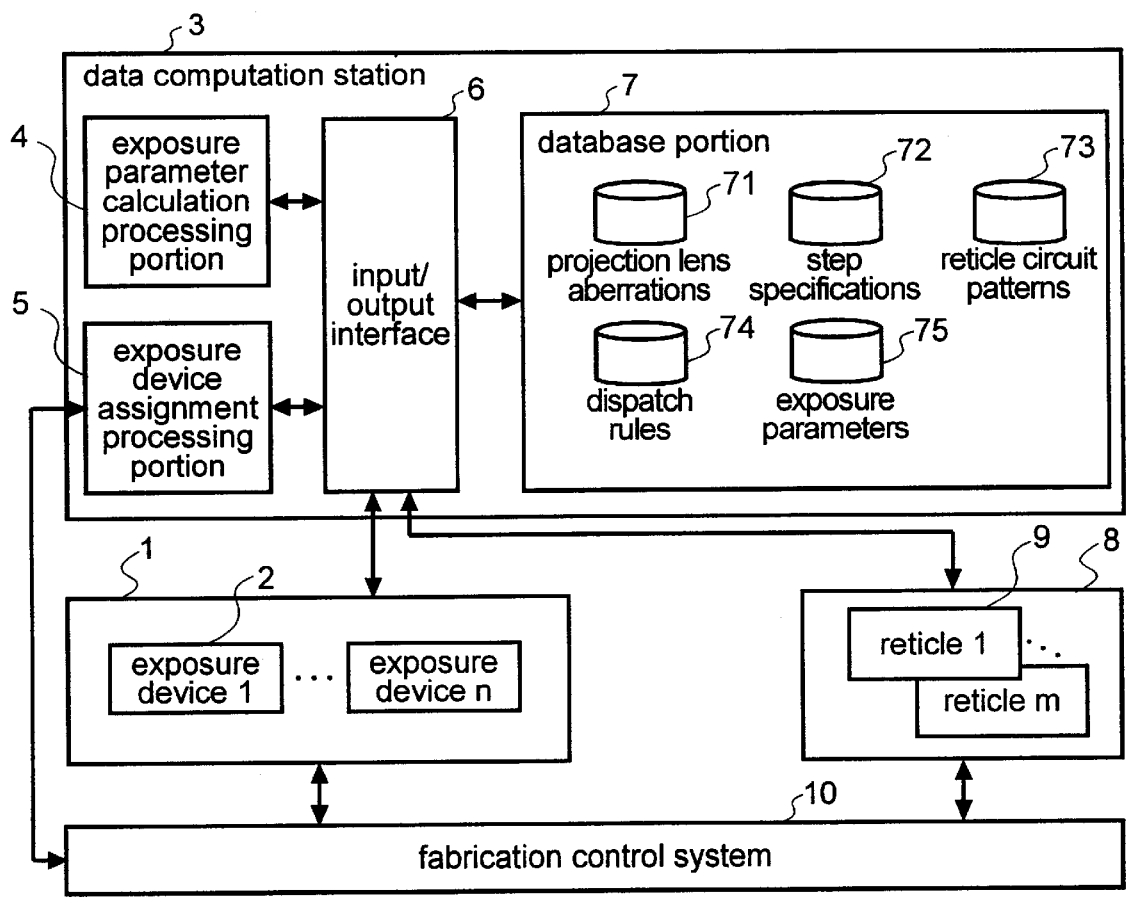
FIG. 1 is a block diagram showing a first embodiment of a method used during a lithography process for exposing semiconductor devices in accordance with the present invention and a system therefor.
Figure 2:
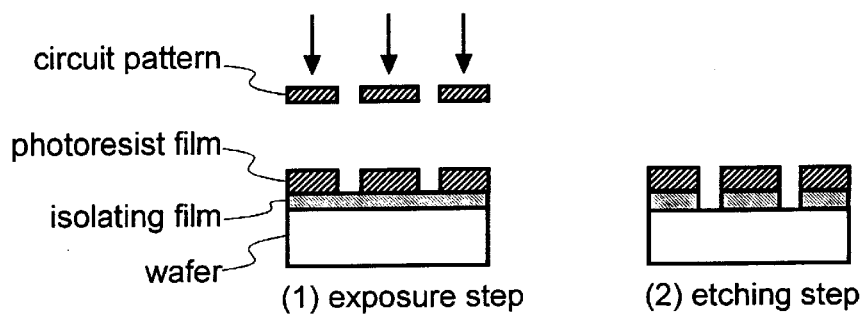
FIG. 2 is a diagram illustrating a pattern transfer method for the fabrication of semiconductor devices.
Figure 3:
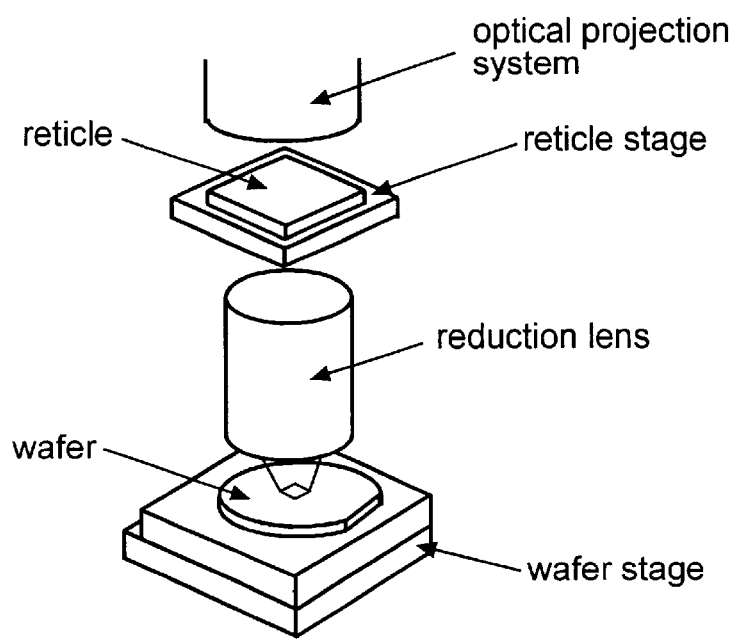
FIG. 3 is a diagram showing the configuration of a reduction exposure projection device.
Figure 4:
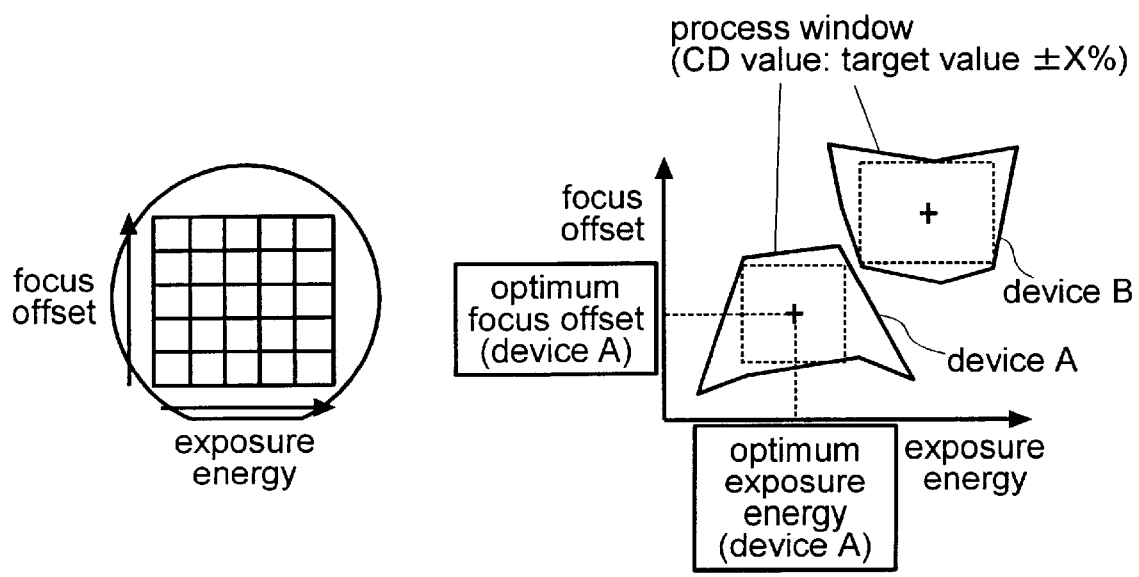
FIG. 4 is a diagram illustrating a method for calculating exposure energy and focus offset.

FIG. 1 is a block diagram showing the overall configuration of a first embodiment of the present invention. In FIG. 1, an exposure device group 1 is configured with at least two exposure devices 2. The exposure devices 2 are devices having an optical projection system for pattern transfer. The exposure device group 1 is connected to a data computation station 3 including an exposure parameter (i.e., exposure energy and focus offset) calculation processing portion 4, an exposure device assignment processing portion 5, an input/output interface 6, and a database portion 7. Moreover, the exposure device group 1 is connected to a fabrication control system 10 for controlling the overall semiconductor device fabrication line. During the exposure processing, the semiconductor device type, process step and wafer name can be entered, for example, by reading a serial number provided on the wafer, and sent over a network from the fabrication control system 10.

A reticle set 8 that is made of at least two reticles 9 is connected to the data computation station 3 and the fabrication control system 10. The semiconductor device type for which the reticles are used and the exposure step can be entered, for example, by reading a serial number formed on the reticle, and can be obtained over a network from the fabrication control system 10. It is also possible that there are a plurality of reticles for the same semiconductor device type or exposure step.

The database portion 7 includes a projection lens aberration database 71 in which the projection lens aberration information (such as the Zernike coefficients) for the exposure devices is stored; a process specification database 72 in which the illumination parameters (such as exposure wavelength, numerical aperture NA of the lens, illumination coherency σ) of the optical projection system and the photoresist parameters (such as type, thickness developing time) for the various exposure steps of the semiconductor device are stored; a reticle circuit pattern database 73 in which reticle circuit pattern information such as the circuit pattern of the semiconductor device and the measurement results of fabrication discrepancies of the reticles are stored; a dispatch rule database 74 in which dispatch rules for selecting the exposure device used for the exposure processing are registered; and an exposure parameter database 75 in which the exposure parameters (such as exposure energy and focus offset) for each exposure device 2 and semiconductor device exposure step are registered. In response to queries from the exposure parameter calculation processing portion 4 and the exposure device assignment processing portion 5, the relevant data are looked up over the input/output interface 6 and the data serving as the query reply are sent to the exposure parameter calculation processing portion 4 or the exposure device assignment processing portion 5.

Based on the data obtained from database portion 7 and using an optical development simulator, the exposure parameter calculation processing portion 4 calculates the margins for exposure energy and focus as well as the optimum values for exposure energy and focus offset when performing exposure processing with the exposure devices 2. The results of that computation are registered via the input/output interface 8 in the exposure parameter database 75 of the database portion 7. Here "margin" means the range of the exposure energy and focus offset that is within the specification of the CD, and the unit for the margin of the exposure energy is quantity of light, whereas the unit for the focus offset is stage driving distance. If the margins are exceeded, the CD leaves the specification, and defects occur in the semiconductor device. Moreover, the center of the range of exposure energy is the optimum exposure energy, and the center of the range of the focus offset is the optimum focus offset.

Based on the data obtained from database portion 7, the exposure device assignment process portion 5 selects an exposure device and a reticle for carrying out exposure processing from exposure device group 1 and reticle set 8, and the exposure parameters (exposure energy and focus offset) are sent over input/output interface 6 to the exposure devices 2.

Fabrication control portion 10 supervises the operating condition of exposure devices 2 in exposure device group 1 and reticles 9 in reticle set 8, as well as the in-process information of the wafer, and sends reply data in response to queries from the exposure device assignment processing portion 5.

FIG. 5 shows the fluctuation of the exposure energy and the focus offset due to different aberrations of the projection lenses as simulated with an optical development simulator. In the case of spherical aberration, the optimum value of the focus offset fluctuates more than without aberrations. Without aberration, the exposure device has to be corrected by an offset of 0.1 $\mu$m, and with an aberration of 0.05λ, the exposure device has to be corrected by an offset of 0.2 $\mu$m.

Figure 6:
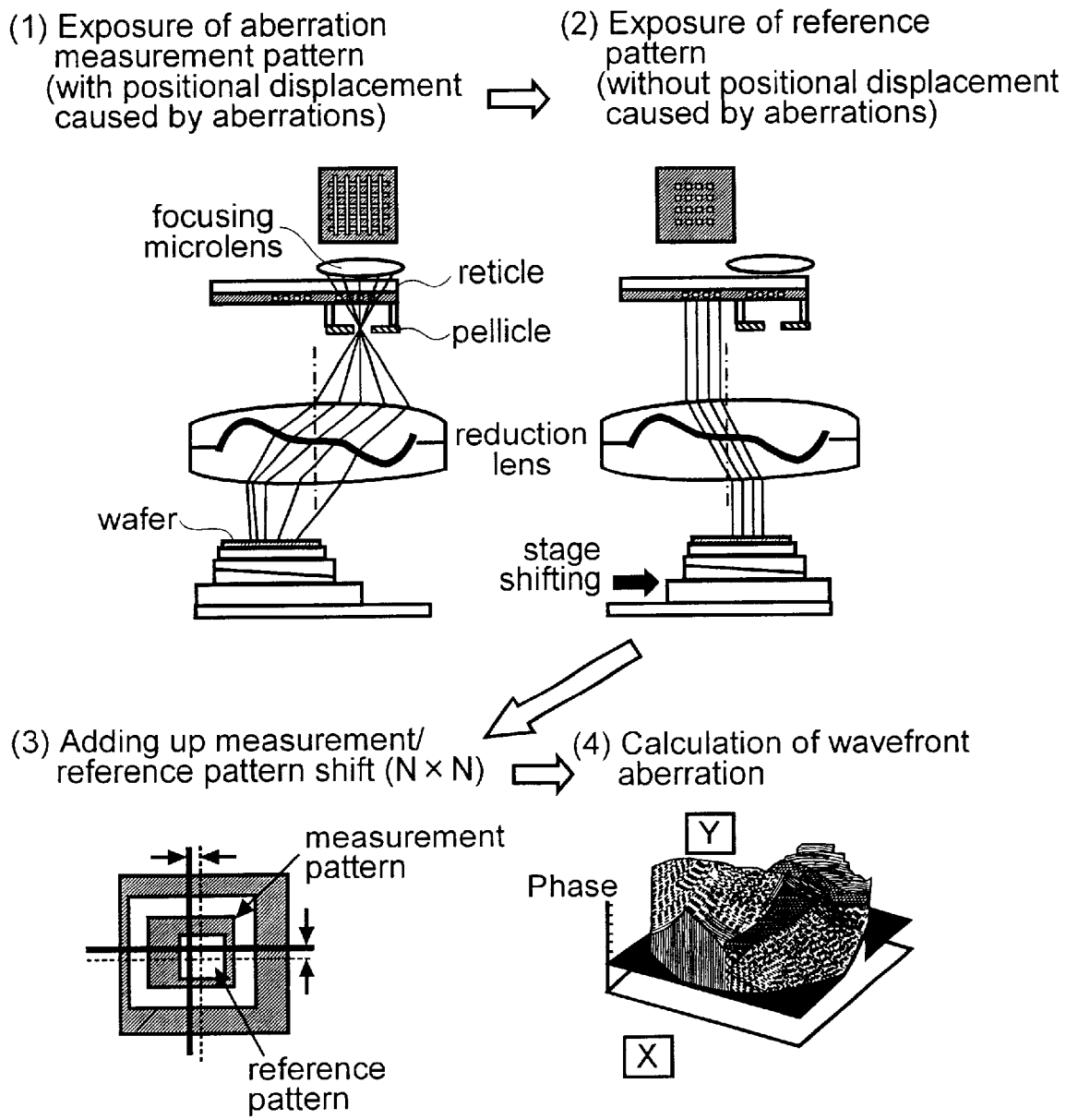
FIG. 6 is a diagram illustrating a method for calculating the aberrations of the projection lenses.

FIG. 6 illustrates a method for measuring the aberration of a projection lens.

(1) First, an aberration measurement pattern is formed generating positional deviations causing an aberration exposed over a focusing microlens.
(2) Then, a reference pattern is formed overlapping the aberration measurement pattern, such that positional deviations causing aberration are not generated.
(3) Then, the shift between the reference pattern and the aberration measurement pattern depending on the height of the lens image is measured.
(4) From the shift between the reference pattern and the aberration measurement pattern in the lens plane, it is possible to calculate the wavefront aberrations, and from the obtained wavefront aberrations it is possible to calculate the Zernike coefficients.

In this embodiment, the Zernike coefficients are stored in the database as the aberration information of the projection lens.

Figure 7:
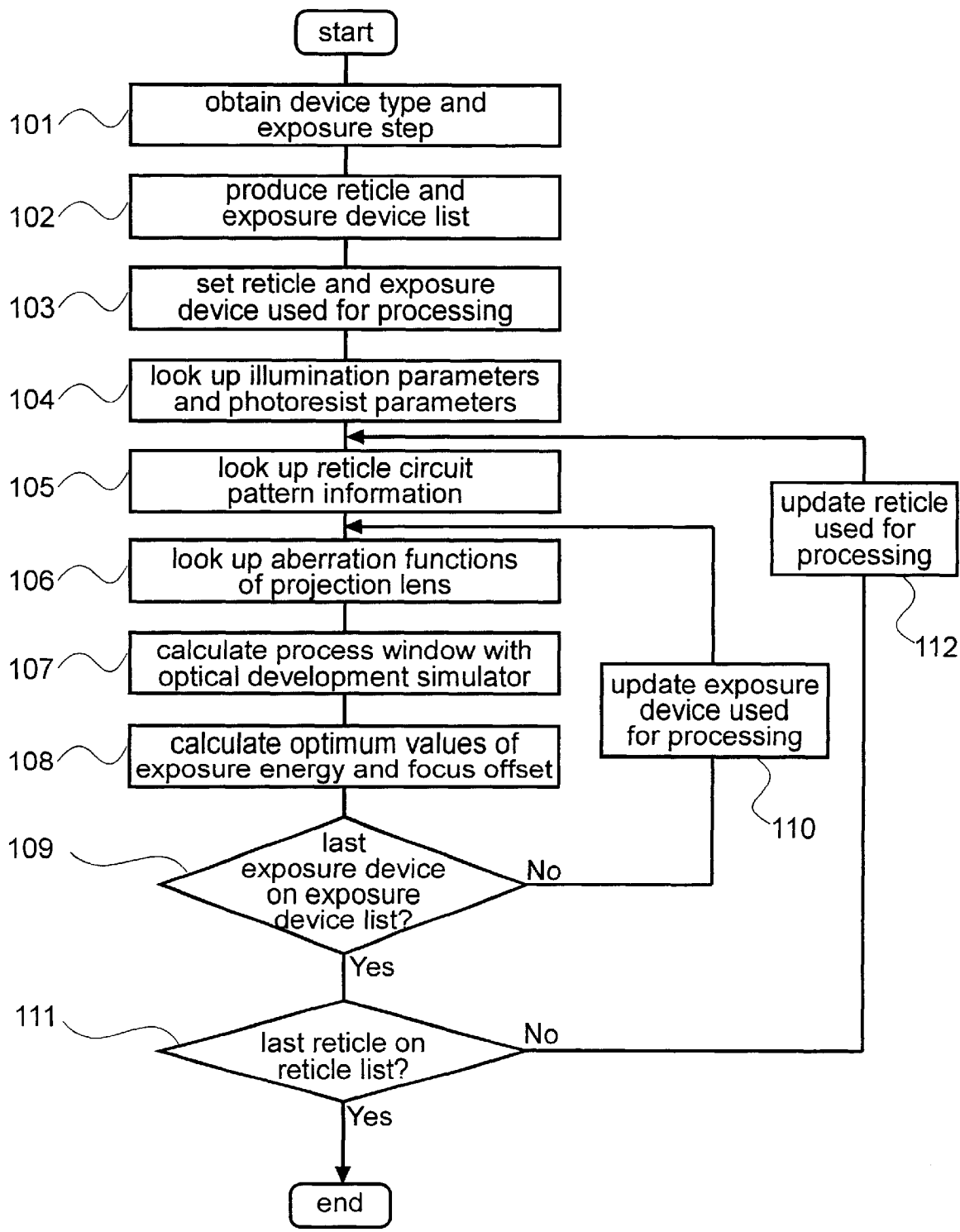
FIG. 7 is a flowchart illustrating a method for calculating the margins for exposure energy and focus as well as for calculating the optimum values of exposure energy and focus offset in accordance with the present invention.

FIG. 7 is a flowchart illustrating the method for calculating the margins for exposure energy and focus as well as the optimum values of exposure energy and focus offset. First, in Step 101, the type of semiconductor device to be processed and the exposure step are obtained from the fabrication control system. In Step 102, the type of semiconductor device as obtained in Step 101, the exposure device used for the exposure step, and the reticle information are obtained from the fabrication control system, and a list of exposure devices and reticles is produced. In Step 103, the exposure device and the reticle with which processing is performed are set as the initial values in the list of exposure devices and reticles. In Step 104, the illumination parameters, the photoresist parameters and the CD tolerances are looked up in the step specification database. Then, in Step 105, the circuit pattern information of the reticle to be processed is looked up. It should be noted that the reticle circuit pattern information includes type of reticle (usually, phase-shift, Levenson, etc.), pattern dimensions, pattern layout (repeating, isolated), pattern fabrication discrepancies, etc. In Step 106, the aberration functions of the projection lens of the exposure device used for the process are looked up in the projection lens aberration database. In Step 107, based on the data looked up in Steps 104 to 106, the range of exposure energy and focus that are still within the CD tolerance value is calculated with an exposure/development simulator, and a process window is produced. At this time, using the aberration functions of the projection lens, the wavefront aberration of the projection lens is generated with the exposure/development simulator. Then, the circuit pattern form corresponding to the wavefront aberration of the projection lens for different exposure energies and focus offsets is generated, and the CD values are calculated.

In Step 108, after determining the center of the process window calculated in Step 107, the optimum exposure energy and focus offset is calculated, and, by combining information from the exposure parameter database regarding the type of semiconductor device, the exposure step, the exposure device and the reticle, the margins for exposure energy and focus, as well as the optimum values of exposure energy and focus offset, are registered. In Step 109, it is determined whether the exposure device used for processing is the last one in the list of exposure devices. If it is not the last one, then the device is updated in Step 110, and the process is repeated from Step 106 onward. If the exposure device used for processing is the last one, then it is determined in Step 111 whether the reticle to be processed is the last one. If it is not the last one, then the exposure device is returned to the initial value, the processed reticle is updated, and the process is repeated from Step 105 onward. If the reticle is the last one, then the process is terminated.

FIG. 8 is a flowchart showing a method for performing exposure processing by selecting an exposure device in which the margins for exposure energy and focus are large. First, in Step 201, the type of semiconductor device subjected to the exposure processing and the exposure step are obtained from the fabrication control system. In Step 202, the operating information for a plurality of exposure devices is obtained from the fabrication control system. The operating information for an exposure device includes the operating conditions of the exposure device and the in-process information of the semiconductor device to be subjected to the next process. In Step 203, the type of semiconductor device to be subjected to processing, as obtained in Step 201, the use conditions of the reticle to be used for the exposure step, and the subsequent use schedule are obtained from the fabrication control system. In Step 204, the dispatch rules of the semiconductor device to be subjected to exposure processing are looked up. In the dispatch rules, the priority rules for each semiconductor device applied to production progress and the assigning of the equipment in accordance with ordering conditions and yield conditions of the fabrication process are defined in IF-THEN format, for example. In Step 205, the process window the exposure step information for a plurality of exposure devices is looked up. In Step 206, the exposure device performing the exposure processing is calculated based on the dispatch rules obtained in FIG. 204. For example, in a semiconductor device for which it has been defined in the dispatch rules that the yield is important, assignment is made with regard to a device and a reticle in which the area of the process window is equal to or greater than the tolerance value in the exposure step, regardless of the operating conditions of the exposure devices and the use conditions of the reticles, thus improving the yield. And with dispatch rules considering both production progress and yield, the priority of exposure device and reticle in view of production progress and the priority of exposure device and reticle in view of yield are weighted, and the exposure device and reticle with the highest total priority are assigned. In Step 207, the optimum values for the exposure energy and focusing offset are looked up using the combination of the exposure device and reticle calculated in Step 206. In Step 208, exposure processing is performed using the exposure device, reticle, exposure energy and focus offset calculated in Steps 206 and 207.

FIG. 12 illustrates a dispatch method that takes into consideration both production progress and progress yield for determining the optimum exposure device and reticle (Step 206 of FIG. 8). In view of production progress, the assessment index P1 of the exposure device to be used is determined with respect to the operating conditions of the exposure device, the use conditions of the reticle and the delivery time of the semiconductor device to be processed.

When the semiconductor device has reached the exposure processing stage, the optimal exposure device to use for the lithographic processing of device in question is selected from an exposure device group made up of the plurality of exposure devices used for exposure processing of each type of semiconductor device. At this time, in a case where priority is given to delivery times, the method for assigning the order in which semiconductor devices are to be processed compares the number of days remaining until the delivery of the devices directly awaiting assignment with the number of days remaining until delivery of the other semiconductor devices waiting for exposure processing, and decides that the highest priority be given the to semiconductor devices with the fewest days left until delivery. Then, in the order of the highest priority position, the operating conditions of the exposure device and the use conditions of the reticle are determined, and if use is possible, then exposure processing is carried out. Moreover, if the exposure device and the reticle cannot be used, then a reservation is made, and the exposure processing is carried out as soon as use becomes possible. For example, the time required to complete the exposure processes for the various exposure devices is added up, and assessment index P1 of the semiconductor devices directly awaiting assignment is calculated from that length of time. For example, if the assessment index P1 for the various exposure devices is expressed by numbers from 0 to 10, then the exposure devices are arranged in the order of the time required for processing completion, and the value obtained by dividing the priority position by the total number of devices is used. In that case, the higher the priority, the larger the index. It is also possible to determine, individually and in advance, the range of time-to-completion for each index, and to set the index in accordance with that range. Here, a method of assigning exposure devices for carrying out the exposure of the semiconductor devices in accordance with the delivery times and the use conditions of the exposure devices and reticles was explained, but the assigning of exposure devices can be similarly carried out, not only in view of delivery, but also in view of other aspects, such as the remaining number of steps or whether there is an operation of reproducing the semiconductor devices.

On the other hand, with regard to yield, the assessment indices P2 of the exposure devices used are calculated in accordance with the size of the process window of the exposure devices (margins for exposure energy and focus offset). The overall assessment indices P are calculated by weighting assessment index P1 with weighting functions calculated in view of production progress, and by weighting assessment index P2 with weighting functions calculated in view of the yield, as defined in the dispatch rules, and the exposure device that is actually used is the one with the largest assessment index P.

The following is an explanation of a method for setting the weighting functions. Usually, the scheduled completion time of the exposure steps is specified in advance, based on the delivery time of the semiconductor devices awaiting assignment. The assessment indices P1 are calculated based on the time-to-completion of the exposure processes, so that the margin for the delivery time in the exposure step for the next exposure process is determined by calculating the difference between the two values. If this value is positive, then the exposure process can be finished earlier than planned, and if it is negative, then the exposure processing will be finished later than planned. Moreover, the assessment indices P2 are determined by calculating the size of the process window, and if the process window is small, this affects the yield. The relationship between the process window and the yield can be determined from the results of evaluating samples of past exposure processing of semiconductor devices. At this time, the obtainable number of chips is separately calculated for each exposure process completion time for the semiconductor devices awaiting assignment. Assessment index P1 is given greater weight if the number of obtainable chips of semiconductor devices awaiting assignment is low, as determined by subtracting the number of chips already produced from the number of chips ordered and comparing that number with the number of obtainable chips of semiconductor devices awaiting assignment. Conversely, if a maximum number of obtainable chips of semiconductor devices awaiting assignment is needed, then assessment index P2 is given greater weight. For example, consider assignment when there is a semiconductor device 1 with an assessment index P1 of 1 and an assessment index P2 of 2, and a semiconductor device 2 with an assessment index P1 of 2 and an assessment index P2 of 1. If there is still time remaining before the delivery time of the semiconductor device directly awaiting assignment, then the exposure device with the highest total index P is assigned as the exposure device with which the assigned semiconductor device will be processed, and the exposure process is carried out. If the exposure device and the reticle are currently being used, then a reservation is made for the exposure device and the reticle, and the process is carried out when they are free for use. Moreover, if the assigned exposure device cannot be used due to a defect or the like, then the exposure device with the next highest total index is assigned.

FIG. 9 is a diagram showing an example of an output screen of the calculation results for the exposure device, reticle, exposure energy and focus offset in Steps 207 and 208 of FIG. 8. The name of the semiconductor device, the exposure step, the exposure device performing the exposure process, the name of the reticle, the exposure energy and the focus offset are displayed (though not show in the figure). It should be noted that the output screen displays on the exposure device, on an output terminal of the fabrication control system or on a dedicated output terminal.

Figure 10:
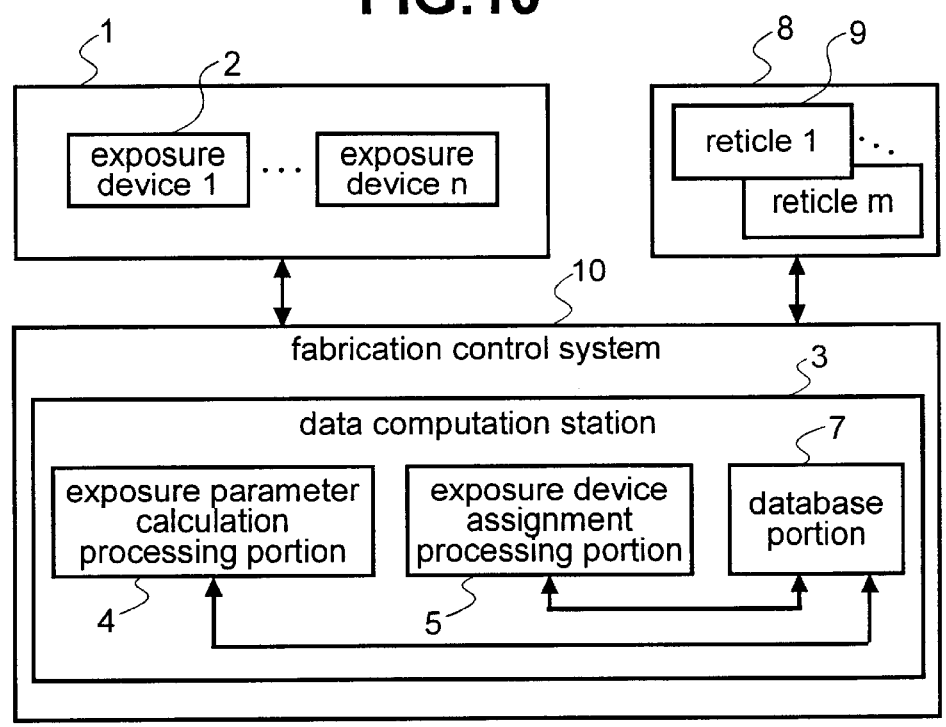
FIG. 10 is a block diagram illustrating a second embodiment of the present invention.

FIG. 10 is a block diagram illustrating a second embodiment of the present invention. It should be noted that elements equivalent to those in FIG. 1 are marked by like numerals. In this embodiment, data computation station 3 including database portion 7, exposure parameter calculation processing portion 4, and exposure device assignment processing portion 5, is built into fabrication control system 10, and all processes are performed.

Figure 11:
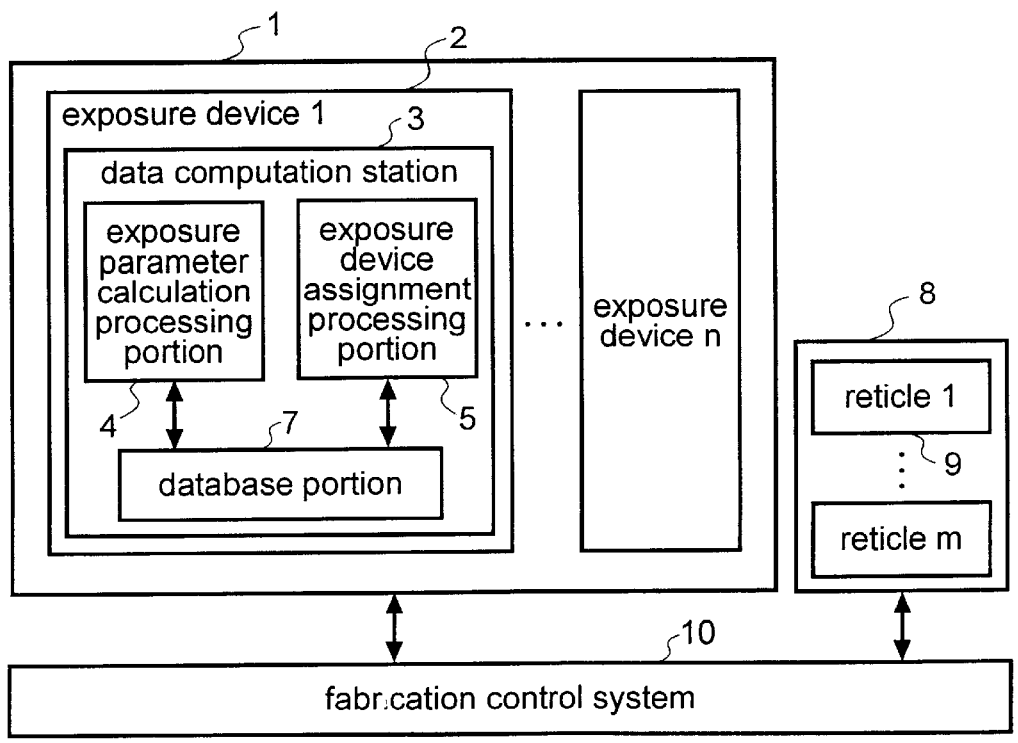
FIG. 11 is a block diagram illustrating a third embodiment of the present invention.

FIG. 11 is a block diagram illustrating a third embodiment of the present invention. It should be noted that elements equivalent to those in FIG. 1 are marked by like numerals. In this embodiment, data computation station 3 including database portion 7, exposure parameter calculation processing portion 4, and exposure device assignment processing portion 5, is built into each of the exposure devices 2, and all processes are performed.

The above-described embodiments have been explained for application of the present invention to exposure devices used in the fabrication of semiconductor devices, but the present invention is not limited to the fabrication of semiconductor devices, and can similarly be applied to manufacturing methods using projection-type exposure devices.

The present invention calculates the exposure energy and the focus offset set for each exposure device in the exposure steps of semiconductor device fabrication, using previously obtained projection lens aberrations of the exposure devices in accordance with illumination parameters of the optical projection system, photoresist parameters, and circuit pattern information. In addition, the present invention uses an optical development simulator, to reduce the number of times exposure condition extraction has to be performed in semiconductor device exposure processing where a plurality of exposure devices is used, and the exposure energy and focus offset must be calculated, using test wafers, for each exposure step and exposure device. Accordingly, the operation efficiency of the exposure devices can be improved, and the TAT of semiconductor devices can be diminished.

Moreover, the present invention has the function of carrying out exposure processing with a selected exposure device, from a plurality of exposure devices, that has a large process window, so that defects caused by the exposure step in a new semiconductor device fabrication can be decreased, and the yield can be improved.

What is claimed is:

1. A method for exposure processing of a semiconductor device in which a predetermined pattern is transferred onto a semiconductor device, comprising:

a step of reading, from a database, illumination parameters, photoresist parameters, circuit pattern information and aberration information of projection lenses used in a plurality of exposure devices, for carrying out the pattern transfer;

a step of performing optical development simulation based on the illumination parameters, photoresist parameters, circuit pattern information and the plurality of sets of aberration information, for carrying out the pattern transfer;

a step of calculating margins of exposure energy and focus as well as optimum values of exposure energy and focus offset; and a step of carrying out the exposure process using, from the plurality of exposure devices, an exposure device for which the margins of exposure energy and focus satisfy a predetermined tolerance.

2. The method for exposure processing of a semiconductor device in accordance with claim 1, further comprising:

a step of calculating an assignment priority order of exposure devices using the margins of exposure energy and focus in the plurality of exposure devices calculated by the calculation step; and an exposure device assignment step of selecting an exposure device used for the exposure processing based on the priority order of the exposure devices.

3. The method for exposure processing of a semiconductor device in accordance with claim 1, wherein the exposure parameter calculation step determines, with an optical development simulator, ranges of exposure energy and focus in which variations of the transfer pattern are within a predetermined range, and takes their central values as the optimum values of exposure energy and focus offset.

4. The method for exposure processing of a semiconductor device in accordance with claim 2, wherein the exposure device assignment step comprises:

(1) a step of calculating an assignment priority order for each exposure device, based on order conditions for the semiconductor device and on production progress information of a semiconductor fabrication line;

(2) a step of calculating an assignment priority order from margins of exposure energy and focus calculated in the exposure parameter calculation step; and (3) a step of calculating an assignment priority order in a process using weighting functions set for the semiconductor device in accordance with the assignment priority orders of the exposure devices calculated in said steps (1) and (2).

* * * * *